(12) United States Patent
Brady et al.

(10) Patent No.: US 6,670,242 B1
(45) Date of Patent: *Dec. 30, 2003

(54) METHOD FOR MAKING AN INTEGRATED CIRCUIT DEVICE INCLUDING A GRADED, GROWN, HIGH QUALITY GATE OXIDE LAYER AND A NITRIDE LAYER

(75) Inventors: David Charles Brady, Windermere, FL (US); Yi Ma, Orlando, FL (US); Pradip Kumar Roy, Orlando, FL (US)

(73) Assignee: Agere Systems Inc., Allentown, PA (US)

( * ) Notice: Subject to any disclaimer, the term of this patent is extended or adjusted under 35 U.S.C. 154(b) by 0 days.

This patent is subject to a terminal disclaimer.

(21) Appl. No.: 09/651,447

(22) Filed: Aug. 30, 2000

Related U.S. Application Data

(63) Continuation-in-part of application No. 09/597,907, filed on Jun. 20, 2000, now Pat. No. 6,521,496.
(60) Provisional application No. 60/140,666, filed on Jun. 24, 1999, and provisional application No. 60/140,909, filed on Jun. 24, 1999.

(51) Int. Cl.$^7$ .............................................. H01L 21/336
(52) U.S. Cl. ...................... 438/261; 438/264; 438/287; 438/770
(58) Field of Search ................................ 438/261, 263, 438/264, 770, 787, 287

(56) References Cited

U.S. PATENT DOCUMENTS

| | | | |
|---|---|---|---|
| 4,277,320 A | * 7/1981 | Beguwala et al. | 204/164 |
| 4,518,630 A | 5/1985 | Grasser | 427/93 |
| 4,826,779 A | 5/1989 | Wright et al. | |
| 4,851,370 A | 7/1989 | Doklan et al. | 437/225 |
| 5,016,081 A | 5/1991 | Brown et al. | 357/67 |
| 5,077,691 A | 12/1991 | Haddad et al. | 365/218 |

(List continued on next page.)

FOREIGN PATENT DOCUMENTS

| | | |
|---|---|---|
| EP | 0301460 | 2/1989 |
| EP | 0 323 071 | 5/1989 |
| GB | 2 056 174 A | 8/1979 |

(List continued on next page.)

OTHER PUBLICATIONS

Cramer et al., *Sodium passivation dependence on phosphorous concentration in tetraethylorthosilicate plasma–enhanced chemical vapor deposited phosphosilicate glasses*, J. Appl. Phys. 73 (5), Mar. 1, 1993, p. 2458–2461.

Kraft et al., *Surface nitridation of silicon dioxide with a high density nitrogen plasma*, J. Vac. Sci. Technol. B 15(4), Jul./Aug. 1997, p. 967–970.

(List continued on next page.)

*Primary Examiner*—Michael Trinh

(57) ABSTRACT

A method for making an integrated circuit device includes forming source and drain regions in a semiconductor substrate and defining a channel region therebetween, forming a graded, grown, gate oxide layer adjacent the channel region, forming a nitride layer adjacent the gate oxide layer, and forming a gate electrode layer adjacent the nitride layer. The gate oxide layer may be formed by growing a first oxide portion by upwardly ramping the channel region to a first temperature lower than a glass transition temperature, and exposing the channel region to an oxidizing ambient at the first temperature and for a first time period. A second oxide portion may be grown between the first oxide portion and the channel region by exposing the channel region to an oxidizing ambient at a second temperature higher than the glass transition temperature for a second time period so that the second oxide portion has a thickness in a range of about 2% to about 75% of a total thickness of the gate oxide layer. Forming the nitride layer may include forming a non-stoichiometric nitride layer, and the nitride layer is preferably formed to have a thickness of less than about 15 Å. The nitride layer reduces penetration of a dopant, such as boron, into the gate oxide layer.

20 Claims, 5 Drawing Sheets

U.S. PATENT DOCUMENTS

| | | | | |
|---|---|---|---|---|
| 5,089,441 | A | 2/1992 | Moslehi | 437/225 |
| 5,153,701 | A | 10/1992 | Roy | 357/54 |
| 5,334,556 | A | 8/1994 | Guldi | 437/248 |
| 5,371,394 | A | 12/1994 | Ma et al. | 257/335 |
| 5,514,608 | A | 5/1996 | Williams et al. | 437/44 |
| 5,567,638 | A | 10/1996 | Lin et al. | 438/592 |
| 5,598,369 | A | 1/1997 | Chen et al. | 365/185.27 |
| 5,619,052 | A | 4/1997 | Chang et al. | 257/321 |
| 5,622,607 | A | 4/1997 | Yamazaki et al. | 204/192.15 |
| 5,629,221 | A * | 5/1997 | Chao et al. | 438/591 |
| 5,707,888 | A | 1/1998 | Aronowitz et al. | 437/69 |
| 5,739,580 | A | 4/1998 | Aronowitz et al. | 257/647 |
| 5,757,204 | A | 5/1998 | Nayak et al. | 324/769 |
| 5,814,562 | A | 9/1998 | Green et al. | 438/708 |
| 5,817,581 | A | 10/1998 | Bayer et al. | |
| 5,821,158 | A | 10/1998 | Shishiguchi | 438/528 |
| 5,851,892 | A | 12/1998 | Lojek et al. | 438/305 |
| 5,863,831 | A | 1/1999 | Ling et al. | 438/515 |
| 5,867,425 | A | 2/1999 | Wong | 365/185.08 |
| 5,869,405 | A | 2/1999 | Gonzalez et al. | 438/770 |
| 5,877,057 | A | 3/1999 | Gardner et al. | 438/301 |
| 5,885,870 | A | 3/1999 | Maiti et al. | 438/261 |
| 5,891,809 | A | 4/1999 | Chau et al. | 438/770 |
| 5,913,149 | A * | 6/1999 | Thakur et al. | 438/762 |
| 5,918,137 | A | 6/1999 | Ng et al. | 438/454 |
| 5,926,741 | A | 7/1999 | Matsuoka et al. | 438/778 |
| 5,968,279 | A | 10/1999 | MacLeish et al. | 134/1.2 |
| 5,972,804 | A * | 10/1999 | Tobin et al. | 438/770 |
| 6,008,128 | A | 12/1999 | Habuka et al. | 438/695 |
| 6,020,247 | A | 2/2000 | Wilk et al. | 438/398 |
| 6,025,280 | A | 2/2000 | Brady et al. | |
| 6,027,975 | A | 2/2000 | Hergenrother et al. | |
| 6,029,680 | A | 2/2000 | Hawthorne et al. | 134/1.3 |
| 6,069,062 | A * | 5/2000 | Downey | 438/528 |
| 6,083,815 | A | 7/2000 | Tsai et al. | 438/585 |
| 6,083,836 | A | 7/2000 | Rodder | 438/690 |
| 6,180,454 | B1 | 1/2001 | Chang et al. | 438/257 |
| 6,197,641 | B1 | 3/2001 | Hergenrother et al. | |
| 6,207,591 | B1 | 3/2001 | Aoki et al. | |
| 6,210,999 | B1 | 4/2001 | Gardner et al. | |
| 6,222,233 | B1 | 4/2001 | D'Anna | 257/343 |
| 6,281,140 | B1 | 8/2001 | Chen et al. | 438/763 |
| 6,281,559 | B1 | 8/2001 | Yu et al. | 257/407 |
| 6,316,300 | B1 | 11/2001 | Ozeki et al. | |

FOREIGN PATENT DOCUMENTS

| | | |
|---|---|---|
| GB | 2 347 265 | 12/2000 |
| JP | 62 079 628 | 4/1987 |
| JP | 01204435 A6 | 8/1989 |
| WO | WO 96/33510 | 4/1995 |

OTHER PUBLICATIONS

Chatterjee et al., *Sub–100nm Gate Layer Metal Gate NMOS Transistors Fabricated by a Replacement Gate Process*, IDEM Tech. Dig., p. 821–824 (1997).

Hattangady et al., *Remote Plasma Nitirded Oxides for Ultrahtin Gate Dielctric Applications*, SPIE 1998 Symp. Microelec. Manuf./Sep. 1998/Santa Clara, CA.

Lee et al., *Enhancement of PMOS Device Performance with Poly–SiGe Gate*, IEEE Electronic Device Letters, vol. 20, No. 5, May 1999, p. 232–234.

Ponomarev et al., *High–Performance Deep SubMicron CMOS Technologies with Polycrystalline–SiGe Gates*, IEEE Electronic Device Letters, vol. 47, No. 4, Apr. 2000, p. 848–855.

Rau et al., "Characterization of Stacked Gate Oxides by Electron Holography" published by the American Institute of Physics on Mar. 28, 1996, pp. 3410–3412.

Wu et al., "Improvement of Gate Dielectric Reliability for p+ Poly MOS Devices Using Remote PECVD Top Nitride Deposition on Thin Gate Oxides" by Wu et al, published in 1998, pp. 70–75.

Wolf, Silicon Processing for the VLSI Era, vol. 2: Process Integration, Lattice Press, Sunset Beach, CA, pp. 354–361, 1990.

Hattangady et al. *Ultrathin Nitrogen–Profile Engineered Gate Dielectric Films*, IEEE IEDM Tech. Digest, p. 495, 1996.

Tseng et al., *Reduced Gate Leakage Current and Boron Penetration of 0.18 $\mu m$ 1.5 V MOSFETs Using Integrated RTCVD Oxynitride Gate Dielectric*, IEDM Tech. Digest, pp. 793–796, 1998.

Song et al., *Ultra Thin (<20 Å) CVD $Si_3 N_4$ Gate Dielectric for Deep–Sub–Micron CMOS Devices, Int. Electron Device-sMtg. Tech. Digest*, San Francisco, CA, Dec. 1998.

U.S. patent application Ser. No. 09/597,077, Chen et al., filed Jun. 20, 2000, 26 pages.

U.S. patent application Ser. No. 09/481992, Chen et al., filed Jan. 11, 2000, 30 pages.

"Silicon Processing for the VLSI Era" Vol. I: Process Technology; by Wolf, et al.; Lattice Press; Sunset Beach, California; 1986; p. 5.

"VLSI Fabrication Principles" Silicon and Gallium Arsenide; by Sorab K. Ghandhi; A Wiley–Interscience Publication; p. 453; 1994.

* cited by examiner

METHOD FOR MAKING AN INTEGRATED CIRCUIT DEVICE INCLUDING A GRADED, GROWN, HIGH QUALITY GATE OXIDE LAYER AND A NITRIDE LAYER

RELATED APPLICATION

The present application is a continuation-in-part application of U.S. patent application, Ser. No. 09/597,907, filed Jun. 20, 2000, U.S. Pat. No. 6,521,496, which in turn is based upon provisional application Nos. 60/140,666 and 60/140,909 filed Jun. 24, 1999, all of which are hereby incorporated herein in their entirety by reference.

FIELD OF THE INVENTION

The present invention relates to the field of integrated circuits, and, more particularly, to metal oxide semiconductor (MOS) devices.

BACKGROUND OF THE INVENTION

Semiconductor devices in the form of integrated circuits are widely used in most electronic devices. For example, computers, cellular telephones, and other similar devices typically include one or more integrated circuits (ICs). In addition, many typical types of ICs are based upon MOS technology wherein each transistor includes doped source and drain regions in a semiconductor substrate, with a well or channel region between the drain and source.

One such MOS device is the P-channel MOS (PMOS) transistor, which includes P-type source and drain regions in an N-type substrate. The source and drain define a channel region in the substrate therebetween. A gate including a gate oxide layer and a gate electrode layer, for example, may be stacked adjacent the channel region. The P-type source and drain regions may be formed using a P-type dopant, such as boron, and the gate electrode layer may also be doped with boron to promote conductivity.

As device dimensions have been reduced in semiconductor processing, the quality of the oxides has become even more important. A preferred approach to forming the oxides may be by thermal oxidation. The thermally grown oxide provides good electrical performance, provides good mechanical bonding to the underlying polysilicon and/or silicon substrate, and helps to block ion implantation and diffusion of dopants into the channel region.

U.S. Pat. No. 5,869,405 to Gonzalez et al. discloses in situ rapid thermal etching and oxidation to form an oxide. In particular, an oxidation step is followed by an etch step to remove contamination and damage from the substrate. Repeated in situ oxidation and etch steps may be used until a desired removal of contamination or silicon damage is achieved.

U.S. Pat. No. 5,851,892 to Lojek et al. discloses a method for making an oxide including both pre- and post-oxidation anneal steps. The patent provides that the anneals, the ambients selected, and various cleaning steps help ensure a high quality gate or tunnel oxide. A portion of the oxide layer grown during the high temperature (1000° C.) anneal and subsequent cool down is desirably reduced to less than about 20 Å, and its growth is the necessary byproduct of incorporating oxygen into the oxide bulk for the benefit of improving electrical performance. The oxide layer is described as having an overall thickness of 100 Å.

As device dimensions scale down rapidly with the advance of manufacturing technologies, the electric field in the thin oxides continues to increase. Part of the consequence of such increased electric field and the thinning of the oxides is the increased trap generation at the oxide interface or within the thin oxides. The trap generation and the capture of channel electrons by the traps in turn leads to increased low frequency noise and transconductance degradation. Additionally, increased current leakage through the reduced oxide layer is also a problem.

The use of boron as a dopant in PMOS devices poses still further problems as gate and gate oxide dimensions are scaled down. Boron has a relatively low atomic number, and as a result low implantation energies must be used to keep the boron within a thin surface layer. Furthermore, implanted boron tends to penetrate through crystalline (e.g., silicon) substrates making it difficult to control the depth of doping.

Various prior art attempts have been made to address these problems associated with boron doping. For example, an article entitled "Reduced Gate Leakage Current and Boron Penetration of 0.18 $\mu$m 1.5 V MOSFETs Using Integrated RTCVD Oxynitride Gate Dielectric" by Tseng et al., discloses a method of depositing an oxynitride film using a form of chemical vapor deposition (CVD) to reduce gate leakage current and boron penetration. Another example is found in U.S. Pat. No. 5,863,831 to Ling et al. entitled "Process for Fabricating Semiconductor Devices with Shallow P-type Regions Using Dopant Compounds Containing Elements of High Solid Solubility." The patent discloses a method for forming shallow P-type regions in a semiconductor device by using a combination dopant including an element which is an acceptor in the substrate material and an element with high solubility in the substrate material. Still another example may be found in U.S. Pat. No. 5,567,638 to Lin et al. entitled "Method for Suppressing Boron in PMOS with Nitridized Polysilicon Gate." The method includes nitridizing a polysilicon gate to prevent boron penetration and thereby improve device reliability.

Unfortunately, despite continuing efforts and developments in the area of forming high quality oxides, device performance and longer term reliability are still compromised by conventional oxides, especially as device dimensions continue to be reduced. The reduction of device dimensions also makes the problems associated with boron doping even more acute.

SUMMARY OF THE INVENTION

In view of the foregoing background, it is therefore an object of the invention to provide a method for making an integrated circuit device including a thin, high quality gate oxide layer and that reduces unwanted boron penetration.

This and other objects, features, and advantages in accordance with the present invention are provided by a method for making an integrated circuit device including forming source and drain regions in a semiconductor substrate and defining a channel region therebetween, forming a graded, grown, gate oxide layer adjacent the channel region, forming a nitride layer adjacent the layer may be implanted with boron. The gate oxide layer may be formed by growing a first oxide portion by upwardly ramping the channel region to a first temperature lower than a glass transition or viscoelastic temperature, and exposing the channel region to an oxidizing ambient at the first temperature and for a first time period. A second oxide portion may be grown between the first oxide portion and the channel region by exposing the channel region to an oxidizing ambient at a second temperature higher than the glass transition temperature for a second time period so that the second oxide portion has a thickness in a range of about 2% to about 75% of a total thickness of the gate oxide layer. Significant performance and reliability gains are provided as a result of the high quality, graded gate oxide layer, and the nitride layer provides still further gains by reducing boron penetration and increasing the dielectric constant of the gate stack.

Forming the nitride layer may include forming a porous nitride layer, and the nitride layer may be an oxynitride layer or a silicon nitride layer, for example. Particularly, the nitride layer may be formed using a silicon-rich nitride or nitrogen-rich nitride, for example. The nitride layer is preferably formed to have a thickness of less than about 15 Å, and the nitride and gate oxide layers may be formed to have an equivalent electrical thickness of less than about 15 Å. The nitride layer may be formed by remote plasma nitridation or by silicon nitride deposition. Doping the gate electrode layer with boron may include implanting boron ions in an energy range of about 3 to about 7 keV and in a dose of about $2 \times 10^{15}$ to about $6 \times 10^{15}$ cm$^{-2}$, for example.

Growing the first oxide portion may include upwardly ramping the temperature at a relatively high ramping rate to reduce any oxide formed during the upward ramping. The relatively high ramping rate may be greater than about 35° C./minute, for example. Growing the first oxide portion may also include exposing the channel region to an oxidizing ambient containing a relatively small amount of oxygen during the upward ramping to reduce any oxide formed during upward ramping. The relatively small amount of oxygen is less than about 10% by volume. Furthermore, growing the first oxide portion may include upwardly ramping at a relatively high rate and in an ambient so that an oxide thickness formed during the upward ramping is in a range of about 5 to about 30% of the total thickness of the gate oxide layer.

The gate oxide layer may be formed to have a thickness of less than about 50 Å. The first temperature may be less than about 900° C., and the second temperature may be greater than about 925° C. More specifically, the first temperature may be in a range of about 750° C. to about 900° C., and the second temperature may be in a range of about 925° C. to about 1100° C. Additionally, the growing steps may be carried out in a single processing apparatus such as a furnace, a rapid thermal processor, and a fast thermal processor, for example.

DETAILED DESCRIPTION OF THE PREFERRED EMBODIMENTS

The present invention will now be described more fully hereinafter with reference to the accompanying drawings, in which preferred embodiments of the invention are shown. This invention may, however, be embodied in many different forms and should not be construed as limited to the embodiments set forth herein. Rather, these embodiments are provided so that this disclosure will be thorough and complete, and will fully convey the scope of the invention to those skilled in the art. Like numbers refer to like elements throughout. The dimensions of layers and regions may be exaggerated in the figures for greater clarity.

Figure 1:
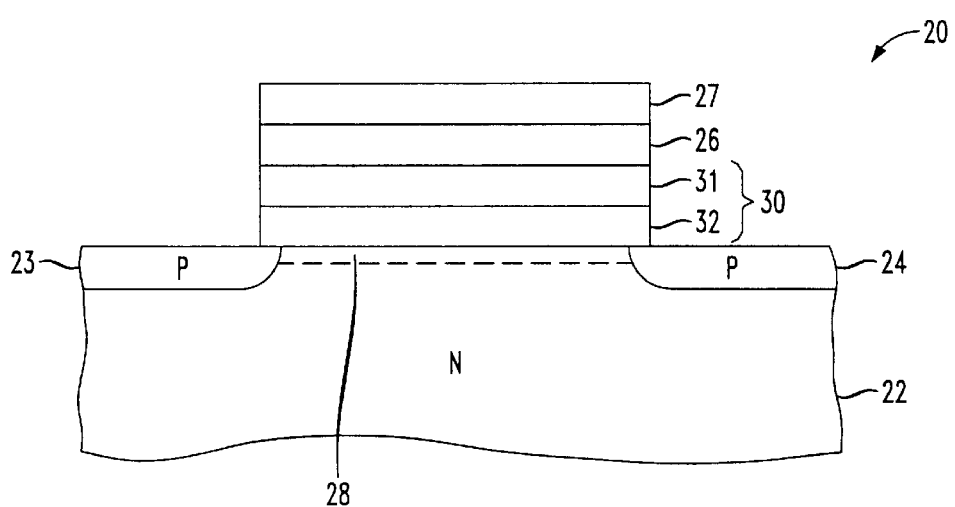
FIG. 1 is schematic cross-sectional view of an integrated circuit device according to the present invention.

Referring now to the schematic block diagram of FIG. 1, a PMOS transistor 20 including a high quality gate oxide layer 30 according to the present invention is first described. The PMOS transistor 20 includes a semiconductor substrate 22 including spaced apart source and drain regions 23, 24, respectively, defining a channel region 28 therebetween. The substrate 22 may be made of silicon, for example. Of course, the source and drain regions 23, 24 may be formed in the substrate 22 by conventional semiconductor fabrication techniques known to those of skill in the art which require no further discussion herein. Furthermore, for a PMOS device the source and drain regions 23, 24 will have a P-type dopant and the substrate 22 will have an N-type dopant. The graded, grown, gate oxide layer 30 is formed adjacent the channel region 28 and includes a first portion 31 and a second portion 32 arranged in stacked relation. The second portion 32 is adjacent the channel region 28 and defines an interface therewith. The gate oxide layer 30 will be discussed further below.

A nitride layer 26 is adjacent the gate oxide layer 30, and a gate electrode layer 27 is adjacent the nitride layer. The gate electrode layer 27 may be silicon or metal, for example, and as noted above the gate electrode layer may be polysilicon doped with boron to promote conductivity. For example, boron ions may be implanted in the gate electrode layer 27 in an energy range of about 3 to about 7 keV and in a dosage of about $2 \times 10^{15}$ to about $6 \times 10^{15}$ cm$^{-2}$.

The nitride layer 26 serves to reduce boron penetration in the PMOS transistor 20, as will be appreciated by those of skill in the art. The nitride layer 26 may be oxynitride or silicon nitride, for example. According to one embodiment of the present invention, the nitride layer 26 may be formed by remote plasma nitridation as disclosed in an article entitled "Remote Plasma Nitrided Oxides for Ultrathin Gate Dielectric Applications," by Hattangady et al., SPIE 1998 Symp. Microelec. Manf., September 1998, which is hereby incorporated herein in its entirety by reference. Furthermore, the nitride layer 26 may be formed using silicon nitride deposition, for example, as disclosed in the above noted article by Tseng et al., which is also hereby incorporated herein in its entirety by reference. Of course, those of skill in the art will appreciate that other suitable techniques for forming the nitride layer 26 may also be used without departing from the scope of the present invention.

The nitride layer 26 is preferably made using the above techniques to be a defective or porous nitride, such as a non-stoichiometric silicon-rich nitride or nitrogen-rich nitride, for example. A porous nitride allows oxidizing species, for example, to pass through the nitride layer to thereby reduce traps between the nitride layer and the gate oxide layer 30. Furthermore, the porous nitride provides better interfaces as well as provides better electrical characteristics, as will be appreciated by those of skill in the art. The nitride layer is preferably no thicker than is necessary to prevent the boron penetration, e.g., less than about 15 Å.

The nitride layer 26 allows the gate oxide layer 30 to be scaled to very low thicknesses without loss of uniformity across the substrate 22, as will be appreciated by those of skill in the art. The effective electrical thickness of the nitride layer 26 is approximately half that of the oxide layer 30 because of the relative dielectric constants. An effective electrical thickness of the nitride layer 26 and gate oxide layer 30 according to the present invention may be less than about 15 Å, for example.

The gate oxide layer 30 provides the desired electrical characteristics in terms of a low interface trap site density, resistance to hot carrier aging, and improved time dependent dielectric breakdown (TDDB), for example. Furthermore, inter-poly leakage between the channel region 28 and the gate electrode layer 27 is reduced due to the stress reduction of the gate oxide layer 30. The wear out behavior is 5 to 15 times longer than for conventional oxides. The TDDB for an oxide having a thickness of about 50 Å, for example, subject to an accelerated stress test of a 2.5 to 7.5 Megavolt field at 150° C. provides a 50% failure rate equivalent to 25 years of normal operation. For a conventional oxide, the TDDB would likely be in the range of about 1–10 years. Accordingly, the present invention overcomes the doomsday prediction of others relating to the downward scaling of the oxide layers as device dimensions continue to be reduced.

One method for making the graded gate oxide layer 30 includes growing a first oxide portion 31 by upwardly ramping the structure to a first temperature lower than a glass transition or visco-elastic temperature, and exposing the structure to an oxidizing ambient at the first temperature and for a first time period. Furthermore, a second oxide portion 32 is grown between the first oxide portion 31 and the channel region 28 by exposing the structure to an oxidizing ambient at a second temperature higher than the glass transition temperature for a second time period. In one embodiment the first and second oxide portions 31, 32 are grown so that the second oxide portion has a thickness in a range of about 2 to about 75% of a total thickness of the graded gate oxide layer 30. The oxidizing ambient may be a dry oxidizing ambient, for example. In other embodiments, a wet oxidizing ambient may be used as will also be appreciated by those skilled in the art.

The method produces a gate oxide layer 30 having graded first and second oxide portions 31, 32 with greatly reduced stress in the areas adjacent the interface between the channel region 28 and the gate oxide layer. By positioning the nitride layer 26 away from this interface, the nitride layer will resist boron penetration without altering the desirable characteristics or enhanced carrier mobility of the interface. Furthermore, the method produces a gate oxide layer 30 having a substantially higher reliability.

One aspect of the invention relates to the step of upwardly ramping the temperature at a relatively high ramping rate to reduce any oxide formed during the upward ramping. For example, the relatively high ramping rate may be greater than about 35° C./minute, although much faster rates are also possible. In addition, the step of growing the first oxide portion 31 may further include exposing the structure to an oxidizing ambient containing a relatively small amount of oxygen during the upward ramping to alternately or additionally reduce any oxide formed during upward ramping. For example, the relatively small amount of oxygen may be less than about 10% by volume, although even smaller percentages may also be used. The step of upwardly ramping may also include upwardly ramping at the relatively high rate and in the ambient so that an oxide thickness formed during the upward ramping is in a range of about 5 to 30%, or less than about 30%, of the total thickness of the graded gate oxide layer 30. For example, for an oxide layer 30 thickness of about 50 Å, the initial or ramp portion of oxide may be about 2–15 Å in thickness.

The total thickness of the graded gate oxide layer 30 may be less than about 50 Å for an ultrathin oxide, for example. For a PMOS transistor made with the nitride layer 26 according to the present invention, the gate oxide layer 30 may be less than about 15 Å, for example, for the reasons noted above. The first temperature may be less than about 900° C., and the second temperature may be greater than about 925° C. More particularly, the first temperature may be in a range of about 750° C. to about 900° C., and the second temperature may be in a range of about 925° C. to about 1100° C.

The growing steps may be carried out in a single processing apparatus in one embodiment of the invention. In another embodiment, the second oxide portion 32 may be added to a pregrown or predeposited first oxide portion 31, for example. The single processing apparatus may be one of a furnace, a rapid thermal processor, and a fast thermal processor, for example.

Figure 2:
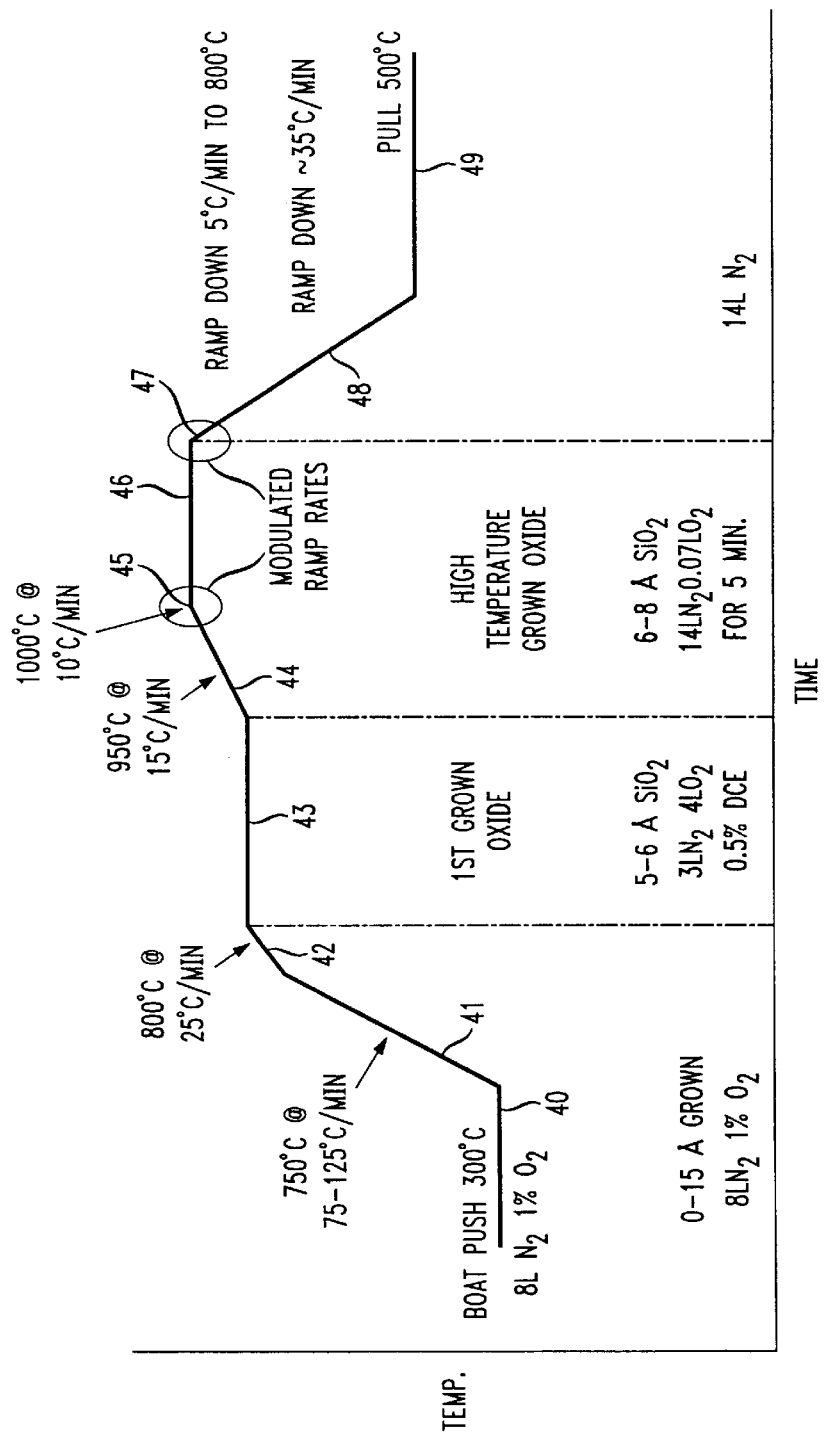
FIG. 2 is a graph of temperature versus time for growing the oxide layer in accordance with a first embodiment of the present invention.

Referring now more particularly to FIG. 2, one sequence for making a graded gate oxide layer 30 by fast thermal processing (FTP) is now described. Segment 40 indicates a wafer boat push step at a temperature of 300° C., a flow of nitrogen of 8 L and 0.1 to 1% oxygen. The same flows are maintained as the temperature is ramped upwardly at 75° C. to 125° C./minute to about 750° C. (segment 41), and then ramped more slowly at 25° C./minute to about 800° C. (segment 42) for better thermal stabilization.

Segment 43 has a nitrogen flow of 3 to 5 L, oxygen flow at 2 to 4 L, and dichloroethylene (DCE) is added at 0 to 0.5% for a time that is dependent upon the desired thickness, as will be readily appreciated by those skilled in the art. For example, in segments 40–42 an oxide thickness in a range of 0–15 Å may be grown, and for the segment 43 about 5–6 Å of oxide may be grown.

Segment 44 is an upward temperature ramp to 950° C. at a rate of about 15° C./minute with a nitrogen flow of 14 L, and an oxygen flow of 0.07 L for about 5 minutes, for example. Segment 45 is a modulated upward ramp segment at about 10° C./minute to 1000° C. with the same flows as segment 45. The temperature of 1000° C. is maintained at segment 46 in a 0.5 (or less) to 50% oxygen ambient for a desired time so that an additional 6–8 Å of oxide may be grown at the high temperature.

Segment 47 represents a temperature ramp down with a rate of about 5° C./minute to a temperature of about 800° C. with only a nitrogen flow of 14 L. The modulated cooling at the relatively slow rate downward to below the glass transition temperature is believed to further relieve stress in the oxide layer 30. Segment 48 represents a further ramp down at a faster rate of about 35° C./minute and segment 49 is the boat pull at about 500° C. with the nitrogen flow at 14 L.

Figure 3:
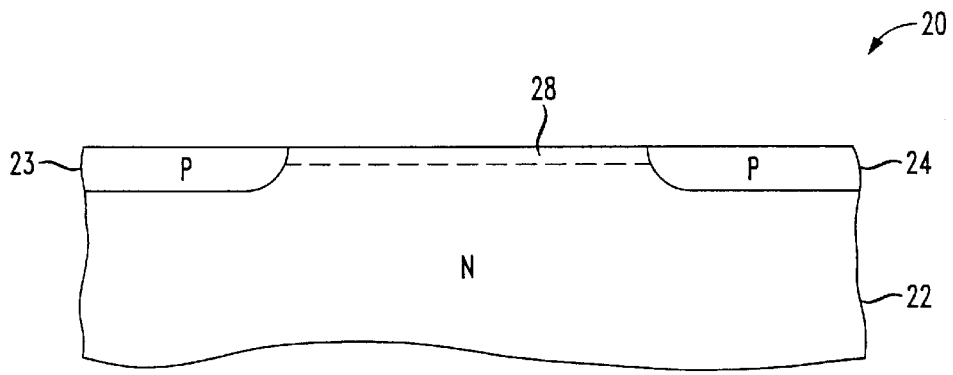
FIGS. 3–5 are schematic cross-sectional views illustrating making of the oxide layer in accordance with the present invention.
Figure 4:
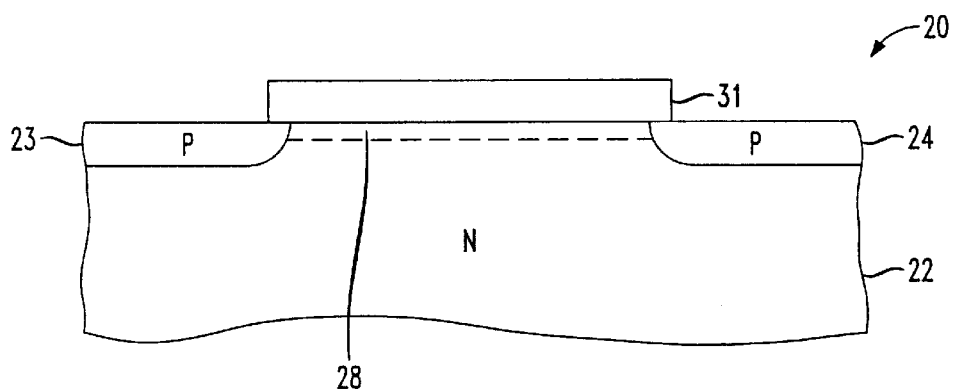
Figure 5:
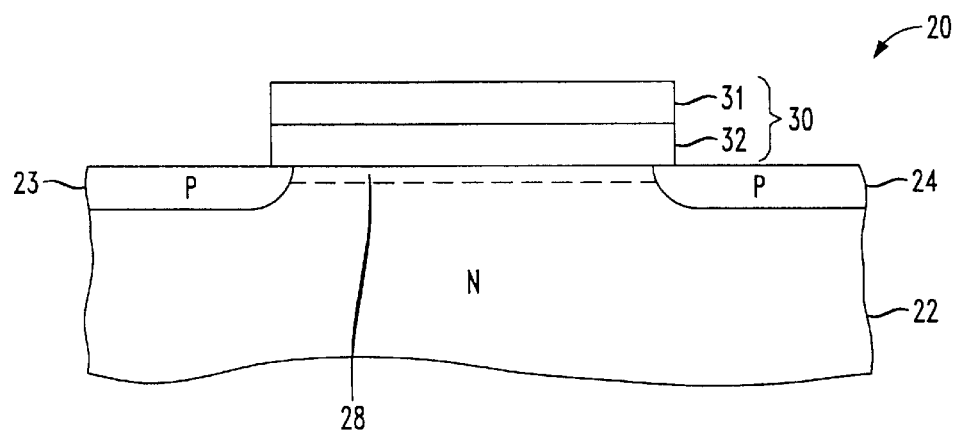

Referring now briefly to FIGS. 3–5, the formation of the gate oxide layer 30 is further illustrated. The substrate 22 (FIG. 3) with the spaced apart source and drain regions 23, 24 and the channel region 28 is heated under the ambient conditions as mentioned above to produce the first oxide portion 31, as shown in FIG. 4. Continuing the heating and processing above the glass transition temperature as also described above produces the gate oxide layer 30 on the channel region 28 as shown in FIG. 5, where the gate oxide layer includes the graded first and second oxide portions 31, 32.

In particular, the first oxide portion 31 may be considered the low temperature portion, that is, formed primarily below about 900° C. The second oxide portion 32 may be considered the high temperature portion which is grown at a temperature of 925° C. to 1100° C. and which may have a thickness of 2–75% of the total thickness of the gate oxide layer 30. This second oxide portion 32 provides a polysilicon-$SiO_2$ interface that is relatively planar and wherein the adjacent oxide and polysilicon portions are relatively stress free. Applicants theorize without wishing to be bound thereto that the formation of the first oxide portion 31 below the glass transition temperature, and the formation of the second oxide portion 32 with the modulation of the heating and cooling near the upper temperature provides the stress relieved gate oxide layer 30.

Figure 6:
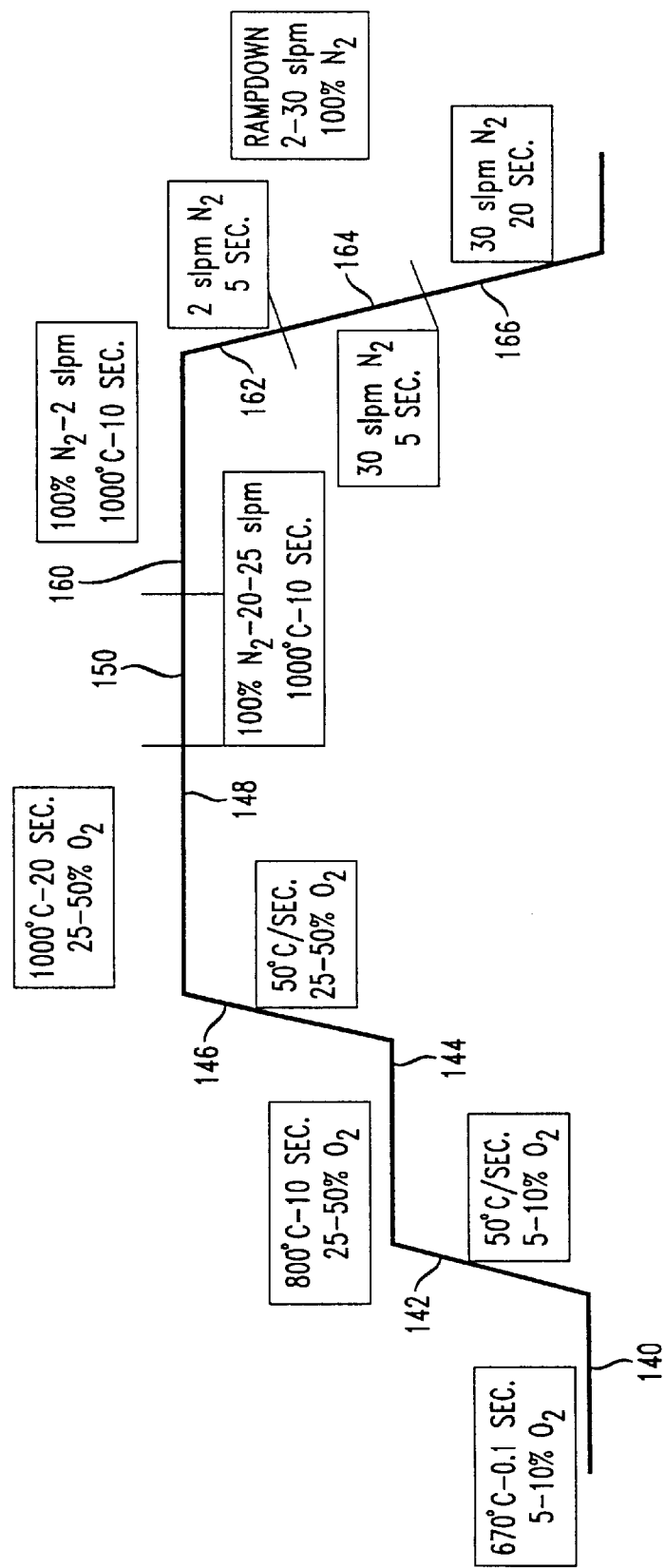
FIG. 6 is a graph of temperature versus time for growing the oxide layer in accordance with a second embodiment of the invention.

Turning now to FIG. 6, a rapid thermal processing (RTP) approach to forming the graded gate oxide layer 30 is now described. In the first horizontal segment 140, the temperature is 670° C. with a 5 to 10% oxygen ambient. Next, in the second segment 142, the temperature is rapidly ramped upward at 50° C./sec. in an ambient containing 5 to 10% oxygen. The first oxide portion 31 is grown primarily at the third segment 144 wherein the temperature is maintained at about 800° C. in a 25 to 50% oxygen ambient, for about 10 sec. A second upward ramp is performed at segment 146 at a rate of about 50° C./sec. to the temperature above the glass transition temperature at segment 148 and for a time of about 20 sec.

At segment 150 the gate oxide layer 30 is subjected to a 100% nitrogen flow of 20 to 25 slpm for about 5 sec., then at segment 160 to a 100% nitrogen flow at a rate of about 2 slpm for about 10 sec. At segment 162 the temperature is ramped downward with a nitrogen flow of about 2 slpm for about 5 sec., then at 30 slpm for about 5 sec. at segment 164, and lastly at segment 166 for about 20 sec. at a 30 slpm flow rate. The temperature ramp down may be at greater than about 25° C./min., for example. Those of skill in the art will appreciate that these times, rates, and other parameters are illustrative of the invention only, and that other values may also be used.

Historically, thermal processing steps during wafer fabrication have been carried out in a furnace. A furnace relies on equilibrium heat transfer conditions to ensure uniform heating of wafers placed therein. This limits the rate of temperature rise in the furnace due to limitations governing uniform heat transfer across each wafer placed in the furnace. Rapid thermal processing (RTP), on the other hand, operates in an inherently transient mode where the various components of the reactor are not in thermal equilibrium with each other. RTP relies on the ability to heat the wafer fast enough that the heat transfer coupling is selective to the wafer relative to other reactor components. This calls for a cold wall reactor that has sufficient thermal mass (or cooling) such that the heat dissipation is limited and the reactor conditions remain constant over a period of time, as will be readily appreciated by those skilled in the art.

Traditionally, difficulties in controlling the power coupling between the wafer and other reactor components, limiting the heat loss from the edge of the wafer, emissivity variations, and poor temperature sensing and control equipment have all limited RTP's ability to compete with furnaces on the basis of temperature uniformity and control, and stability. However, in recent years, improvements in temperature sensing, reactor design, and innovative pyrometry techniques which account for emissivity variations have established RTP as a viable alternative to all thermal processes that were once considered the domain of furnaces.

In order to combine the best features of furnaces and RTPs, the Fast Thermal Processor (FTP) has been developed. The FTP uses a standard vertical furnace configuration with a batch size of up to 100 wafers and enhanced heating and cooling capability to achieve ramp rates up to 100° C./min. A characteristic property of these furnaces equipped with the advanced heater element is that the surface load on the furnace walls is much higher than with metallic elements. This is due to the higher operating temperature of the heater element. The above reduces the heating time considerably. The wall loading is also dependent upon the placement of elements on the wall (along the walls or perpendicular thereto). This improved furnace hardware increases the ramp-up (heating) and ramp down (cooling) rates to reduce overall processing time and cost of ownership.

Both FTPs and RTPs have very good ambient temperature control resulting in minimum native oxide growth and slip dislocation generation during rapid ramp-up and ramp-down of the temperature. This is important for an ultrathin oxide (<50 Å) as the ramp oxide degrades electrical characteristics of the gate oxide and the polysilicon/oxide interface. For FTPs, typically a ramp-up rate of 50–100° C./min. is used in a mildly oxidizing (0.05–0.5% $O_2$) ambient during ramp-up to incur minimum (<10 Å) ramp oxide growth prior to the first oxidation step at 750–900° C. to grow about 50–75% of the total oxide thickness.

Thermal process sequence and ambient control by RTP are similar to that of FTP, except a ramp rate of 50–150° C./sec. is typically used on a single wafer rather than a batch. The final part of the synthesis involves growing the final oxide at a temperature above the glass viscoelastic transition temperature (about 925° C.) under the first grown layer in an oxidizing ambient of 0.5–50% oxygen to generate about 2–75% of the total oxide thickness, which is typically below about 50 Å. This concept of grading, however, is not limited to ultrathin oxides, but can also be used for oxides greater than about 50 Å and for other interlevel oxides. For thicker oxides conventional furnaces can be used as ramp oxides plays a relatively minor role. Ramp down is done in an inert ambient typically 10–50° C./min for FTP and 10–50° C./sec for RTP. This graded, grown, gate oxide allows stress relaxation in the first grown layer while retaining an excellent polysilicon/oxide interface substructure formed at high temperature above the glass transition temperature.

Figure 7:
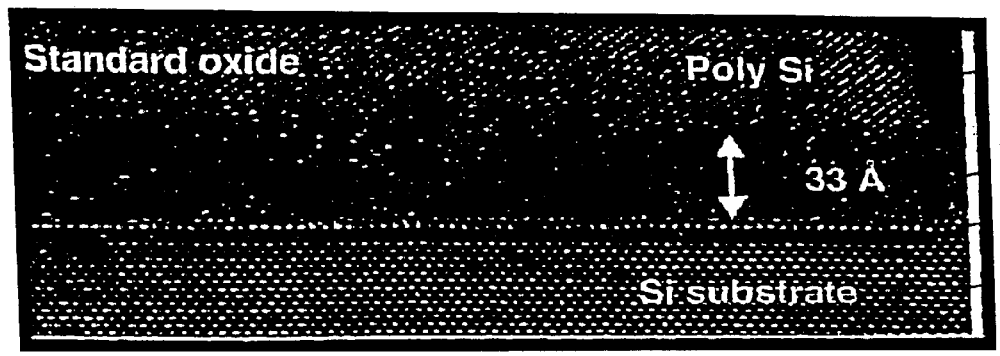
FIG. 7 is a transmission electron microscope (TEM) lattice image of a conventional oxide layer on a substrate and further including a conductive layer on the oxide as in the prior art.

Reliability problems for conventional oxide technology are increasingly important as oxide thickness are reduced to around and/or below about 50 Å. New submicron technologies of 0.16 and 0.12 μm may require an oxide with a thickness below about 25 Å. Many believe that such relatively thin oxides present an insurmountable problem with existing technologies. However, the present invention overcomes the perceived difficulties primarily by addressing stress in the oxide and adjacent the interface. For example, FIG. 7 is a TEM lattice image of a conventionally grown oxide on a silicon substrate, and with a conductive polysilicon gate electrode layer on the oxide. A stress band (dark contrast) is clearly evident in the crystalline lattice of the silicon substrate at the interface region. Stress also exists in the oxide layer; however, the stress band is not visible using the TEM Si(111) lattice image since the oxide layer is amorphous, as will be readily appreciated by those skilled in the art. In addition, the $SiO_2$ interface is relatively rough as will be seen with subsequent comparison to the oxide layer of the present invention.

In general, Applicants theorize that the stress is due to a mismatch of expansion coefficients which are fixed for a particular oxidation temperature (Tox). The stress generated due to the growth condition is a net result of two competing processes:

(1) a decrease in viscosity of the $SiO_2$ with an increase in Tox above the glass transition temperature (Tc), and
(2) structural relaxation that increases the viscosity. In accordance with one aspect of the present invention modulating the ramp rate near Tc thereby relaxes the stress on a pre-grown $SiO_2$ portion 31.

Figure 8:
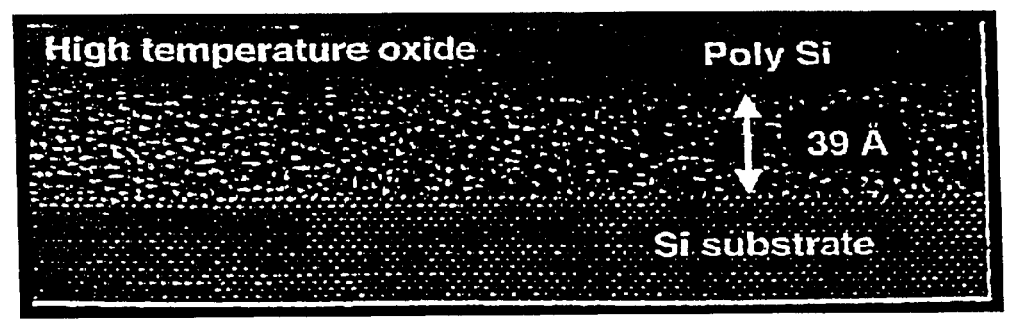
FIG. 8 is a transmission electron microscope (TEM) lattice image of an oxide layer on a substrate and further including a conductive layer on the oxide in accordance with the present invention.

Preliminary carrier concentration profiling under the channel of relevant dopants (phosphorous and boron) indicated that the present invention does not change the threshold voltage for a MOSFET compared to conventional processing sequences. More particularly, as shown in the TEM lattice image of FIG. 8, there is no stress band (dark contrast) as in the conventionally grown oxide as shown in FIG. 7. Instead, the interface between the oxide layer and the silicon is substantially stress free. The oxide portions of the oxide layer are also substantially stress free. In addition, the interface is also substantially planar with a planarity that can typically be less than about 3 Å.

Although the two graded portions 31, 32 are not visible in the amorphous oxide layer 30, those of skill in the art will recognize that other conventional analysis tools may be used to detect the two different portions. For example, backscattering techniques may be used to detect the two graded portions 31, 32 of the oxide layer 30.

Thus, an improved gate oxide layer 30 is provided and has the desired electrical characteristics in terms of a low interface trap site density, resistance to hot carrier aging, and improved time dependent dielectric breakdown (TDDB), for example. Furthermore, the gate oxide layer 30 of the present invention reduces inter-poly leakage due to stress.

Other aspects and features relating to the invention may be found in co-pending U.S. patent application Ser. Nos. 09/597,286, 09/597,909, and 09/481,992, and the application filed on Jun. 20, 2000, attorney docket number 2-18-74-93, entitled "High Quality Oxide For Use In Integrated Circuits", all assigned to the assignee of the present invention, and all of which are hereby incorporated herein in their entirety by reference.

Many modifications and other embodiments of the invention will come to the mind of one skilled in the art having the benefit of the teachings presented in the foregoing descriptions and the associated drawings. Therefore, it is to be understood that the invention is not to be limited to the specific embodiments disclosed, and that other modifications and embodiments are intended to be included within the scope of the appended claims.

That which is claimed is:

1. A method of manufacturing an integrated circuit device, comprising:

forming source and drain regions in a semiconductor substrate and defining a channel region therebetween;

growing a first gate oxide layer portion adjacent the channel region in a chamber by upwardly ramping a temperature of the channel region at a first ramping rate to a first temperature by introducing oxygen into the chamber;

ramping upwardly the channel region temperature at a second ramping rate to a second temperature in the presence of oxygen, wherein the second temperature is less than a glass transition temperature;

growing a second gate oxide layer portion adjacent the first gate oxide layer portion by exposing the channel region to a first oxidizing ambient at the second temperature during a first time period;

ramping upwardly the channel region temperature at a third ramping rate to a third temperature in the presence of oxygen, wherein the third temperature is greater than the glass transition temperature; and growing a third gate oxide layer portion adjacent the channel region by exposing the channel region to a second oxidizing ambient at the third temperature during a second time period, wherein the first, second and third gate oxide layer portions form a graded gate oxide layer.

2. The method recited in claim 1 wherein the oxygen ranges between about 0.1% and about 1.0% by volume of a surrounding ambient during the ramping at the first and second ramping rates.

3. The method recited in claim 1 wherein the third ramping rate is about 15° C./min.

4. The method recited in claim 1 wherein the third temperature is greater than about 925° C.

5. The method recited in claim 1 wherein the first oxidizing ambient includes a nitrogen flow ranging between about 3 L/min and about 5 L/min, an oxygen flow ranging between about 2 L/min and about 4 L/min, and a dichloroethylene (DCE) concentration ranging between 0% and about 0.5% by volume.

6. The method recited in claim 1 wherein a thickness of the graded grown oxide layer is less than about 15 Å.

7. The method recited in claim 1 wherein a thickness of the second gate oxide layer portion ranges between about 5 Å and about 6 Å.

8. The method recited in claim 1 wherein a thickness of the third gate oxide layer portion ranges between about 6 Å and about 8 Å.

9. The method recited in claim 1 further comprising forming a nitride layer adjacent the graded gate oxide layer.

10. The method recited in claim 9 further comprising forming a gate electrode layer adjacent the nitride layer.

11. A method of manufacturing an integrated circuit device, comprising:

forming source and drain regions in a semiconductor substrate and defining a channel region therebetween;

growing a first gate oxide layer portion adjacent the channel region in a chamber by upwardly ramping a temperature of the channel region at a first ramping rate to a first temperature by introducing a gas containing oxygen into the chamber;

ramping upwardly the channel region temperature at a second ramping rate to a second temperature in the presence of a gas containing oxygen, wherein the second temperature is less than a glass transition temperature;

growing a second gate oxide layer portion adjacent the first gate oxide layer portion by exposing the channel region to a first oxidizing ambient containing a gas that includes oxygen at the second temperature during a first time period;

ramping upwardly the channel region temperature at a third ramping rate to a third temperature in the presence of a gas containing oxygen, wherein the third temperature is greater than the glass transition temperature; and growing a third gate oxide layer portion adjacent the channel region by exposing the channel region to a second oxidizing ambient containing a gas that includes oxygen at the third temperature during a second time period, wherein the first, second and third gate oxide layer portions form a graded gate oxide layer.

12. The method recited in claim 11 wherein the oxygen ranges between about 0.1% and about 1.0% by volume of a surrounding ambient during the ramping at the first and second ramping rates.

13. The method recited in claim 11 wherein the third ramping is about 15° C./min.

14. The method recited in claim 11 wherein the third temperature is greater than about 925° C.

15. The method recited in claim 11 wherein the first oxidizing ambient includes a nitrogen flow ranging between about 3 L/min and about 5 L/min, an oxygen flow ranging between about 2 L/min and about 4 L/min, and a dichloroethylene (DCE) concentration ranging between 0% and about 0.5% by volume.

16. The method recited in claim 11 wherein a thickness of the graded grown oxide layer is less than about 15 Å.

17. The method recited in claim 11 wherein a thickness of the second gate oxide layer portion ranges between about 5 Å and about 6 Å.

18. The method recited in claim 11 wherein a thickness of the third gate oxide layer portion ranges between about 6 Å and about 8 Å.

19. The method recited in claim 11 further comprising forming a nitride layer adjacent the graded gate oxide layer.

20. The method recited in claim 19 further comprising forming a gate electrode layer adjacent the nitride layer.

* * * * *